United States Patent
Wages et al.

(10) Patent No.: US 12,332,289 B2
(45) Date of Patent: Jun. 17, 2025

(54) SYSTEMS AND METHODS FOR POWER THEFT DETECTION

(71) Applicants: Duke Energy Corporation, Charlotte, NC (US); A-PLUS Community Solutions, Inc., Roswell, GA (US)

(72) Inventors: Ron K. Wages, Waxhaw, NC (US); Larry J. Morrow, Nashville, GA (US)

(73) Assignee: Duke Energy Corporation, A-PLUS Community Solutions, Inc.

( * ) Notice: Subject to any disclaimer, the term of this patent is extended or adjusted under 35 U.S.C. 154(b) by 276 days.

(21) Appl. No.: 18/057,452

(22) Filed: Nov. 21, 2022

(65) Prior Publication Data
US 2023/0213563 A1    Jul. 6, 2023

Related U.S. Application Data

(60) Provisional application No. 63/266,302, filed on Dec. 31, 2021.

(51) Int. Cl.
    *G01R 27/16*    (2006.01)
(52) U.S. Cl.
    CPC .................... *G01R 27/16* (2013.01)
(58) Field of Classification Search
    CPC ...... G01R 15/12; G01R 15/144; G01R 19/00; G01R 19/30; G01R 21/06; G01R 31/261; G01R 31/2623
    See application file for complete search history.

(56) References Cited

U.S. PATENT DOCUMENTS

| | | | |
|---|---|---|---|
| 7,707,419 B2 | 4/2010 | Sowa et al. | |
| 10,007,779 B1 | 6/2018 | McClintock | |
| 2003/0158677 A1* | 8/2003 | Swarztrauber | G06Q 30/0283 702/62 |
| 2011/0214160 A1 | 9/2011 | Costa et al. | |
| 2012/0059609 A1 | 3/2012 | Oh et al. | |
| 2014/0304500 A1 | 10/2014 | Sun et al. | |
| 2016/0320431 A1* | 11/2016 | Driscoll | G01R 22/066 |
| 2017/0163009 A1 | 6/2017 | Choi | |
| 2018/0143237 A1 | 5/2018 | Beaudet et al. | |

(Continued)

OTHER PUBLICATIONS

International Search Report mailed Mar. 17, 2023 in the corresponding International Patent Application No. PCT/IB2022/062935. 4 pages.

(Continued)

*Primary Examiner* — Tung X Nguyen
(74) *Attorney, Agent, or Firm* — WOMBLE BOND DICKINSON (US) LLP

(57) ABSTRACT

Systems, apparatuses, methods, and computer program products are disclosed for power theft detection. An example method includes receiving, by a control system, telemetry data from a transformer adjacent to a customer premise and a meter at the customer premise and storing, by the control system, the telemetry data in a memory. The example method further includes calculating, by the control system and using the telemetry data, a change in impedance in an electric line segment between the transformer and the meter, and determining, by the control system, whether the change in the impedance in the electric line segment is anomalous. Corresponding apparatuses and computer program products are also disclosed.

20 Claims, 7 Drawing Sheets

(56) References Cited

U.S. PATENT DOCUMENTS

| | | |
|---|---|---|
| 2019/0123580 A1 | 4/2019 | Bindea et al. |
| 2019/0173862 A1 | 6/2019 | Kim et al. |
| 2020/0135321 A1 | 4/2020 | Lebrun et al. |
| 2021/0080514 A1 | 3/2021 | Beaudet et al. |
| 2021/0112034 A1 | 4/2021 | Sundararajan et al. |
| 2021/0218548 A1 | 7/2021 | Abraham et al. |
| 2021/0273786 A1 | 9/2021 | Mendonsa et al. |
| 2022/0011749 A1 | 1/2022 | Lee |
| 2022/0046419 A1 | 2/2022 | Marquardt et al. |
| 2022/0291728 A1 | 9/2022 | Ovadia |

OTHER PUBLICATIONS

United States Patent and Trademark Office; Non-Final Office Action of U.S. Appl. No. 18/057,442; Oct. 16, 2024; 34 pages.

* cited by examiner

SYSTEMS AND METHODS FOR POWER THEFT DETECTION

CROSS REFERENCE TO RELATED APPLICATIONS

The present application claims the benefit of U.S. Provisional Application No. 63/266,302, filed Dec. 31, 2021, which is hereby incorporated by reference in its entirety.

TECHNOLOGICAL FIELD

The present disclosure relates in general to the field of electrical power distribution, and more specifically, to systems for power theft detection using sub-second power variance calculations over time based on the transformer's power output to the meter's power usage. The present disclosure further relates to the subsequent remote disconnection of power based on the power theft detection and/or the reconnection of power thereafter.

BACKGROUND

Modern power distribution grids include many generation and transmission resources used to provide power to different types of user loads. Generation and transmission resources may include generators, transmission lines, substations, transformers, etc.

FIG. 1 is a simplified block diagram illustrating an example electrical power distribution environment 100. Referring to FIG. 1, electric power may be generated at a power generation facility 110 for distribution to users 140A-140N that consume the generated electric power. Examples of power generation facilities 110 include facilities which generate electricity from fossil fuels (e.g., coal, petroleum, and/or natural gas), solar energy, geothermal energy, nuclear energy, potential energy (e.g., with a hydroelectric facility), wind energy, and/or chemical energy.

Once generated at the power generation facility 110, the electricity may be delivered to the users 140A-140N via a power distribution grid. The power grid may include, for example, power transmission lines 115 between the power generation facility 110 and one or more substations 120. The electricity may be further transmitted from a given substation 120 to one or more of users 140A-140N over electrical distribution circuits 130, also known as feeders. For example, the electrical distribution circuit 130 may provide electricity to any one of users 140A-140N via a connection between the electrical distribution circuit 130 and the location (e.g., house or building) of the user, such as, for example, at a power meter. The electrical distribution circuits 130 may include, for example, both overhead and underground power lines. Electrical distribution circuits 130 may include additional segmentation. For example, an electrical distribution circuit 130 may include one or more protective devices 135. Protective devices 135 may include, for example, switches, circuit breakers, and/or reclosers.

Current electric operations determine usage based solely on meter readings at the consumer locations that occur at infrequent intervals each month. With such infrequent meter readings, it is currently not possible to detect small variations in power utilization at customer premises. As a result, it is not practically feasible to systematically identify power theft by a malicious actor without physical inspection of an electric line. Accordingly, a need exists for new tools and techniques for identifying and classifying power loss that may be indicative of power theft.

BRIEF SUMMARY

As described herein, example embodiments utilize a fiber optic network connecting various active devices in the electric grid to enable the capture of impedance measurements at a transformer adjacent to a customer premise and at a meter at the customer premise. Leveraging the data gathered from these devices, example embodiments produce evolving estimates of power loss for the customer premise. From this estimated power loss information, a control system can systematically detect anomalous changes in power loss that may indicate possible theft of power.

To this end, systems, apparatuses, methods, and computer program products are disclosed herein for power theft detection. An example method includes receiving, by a control system, telemetry data from a transformer adjacent to a customer premise and a meter at the customer premise, and storing, by the control system, the telemetry data in a memory. The example method further includes calculating, by the control system and using the telemetry data, a change in impedance in an electric line segment between the transformer and the meter, and determining, by the control system, whether the change in the impedance in the electric line segment is anomalous.

In one example embodiment, an apparatus is provided for power theft detection. The example apparatus includes a processor and a memory storing software instructions that, when executed by the processor, cause the apparatus to receive telemetry data from a transformer adjacent to a customer premise and a meter at the customer premise and store the telemetry data in a memory. The processor and the memory storing software instructions, when executed by the processor, further cause the apparatus to calculate, using the telemetry data, a change in impedance in an electric line segment between the transformer and the meter, and determine whether the change in the impedance in the electric line segment is anomalous.

In one example embodiment, a computer program product is provided for power theft detection The computer program product includes at least one non-transitory computer-readable storage medium storing software instructions that, when executed by an apparatus, cause the apparatus to receive telemetry data from a transformer adjacent to a customer premise and a meter at the customer premise and store the telemetry data in a memory. The at least one non-transitory computer-readable storage medium storing software instructions, when executed by the apparatus, further cause the apparatus to calculate, using the telemetry data, a change in impedance in an electric line segment between the transformer and the meter, and determine whether the change in the impedance in the electric line segment is anomalous.

The foregoing brief summary is provided merely for purposes of summarizing some example embodiments described herein. Because the above-described embodiments are merely examples, they should not be construed to narrow the scope of this disclosure in any way. It will be appreciated that the scope of the present disclosure encompasses many potential embodiments in addition to those summarized above, some of which will be described in further detail below.

BRIEF DESCRIPTION OF THE FIGURES

Having described certain example embodiments in general terms above, reference will now be made to the accompanying drawings, which are not necessarily drawn to scale. Some embodiments may include fewer or more components than those shown in the figures.

DETAILED DESCRIPTION

Figure 1:
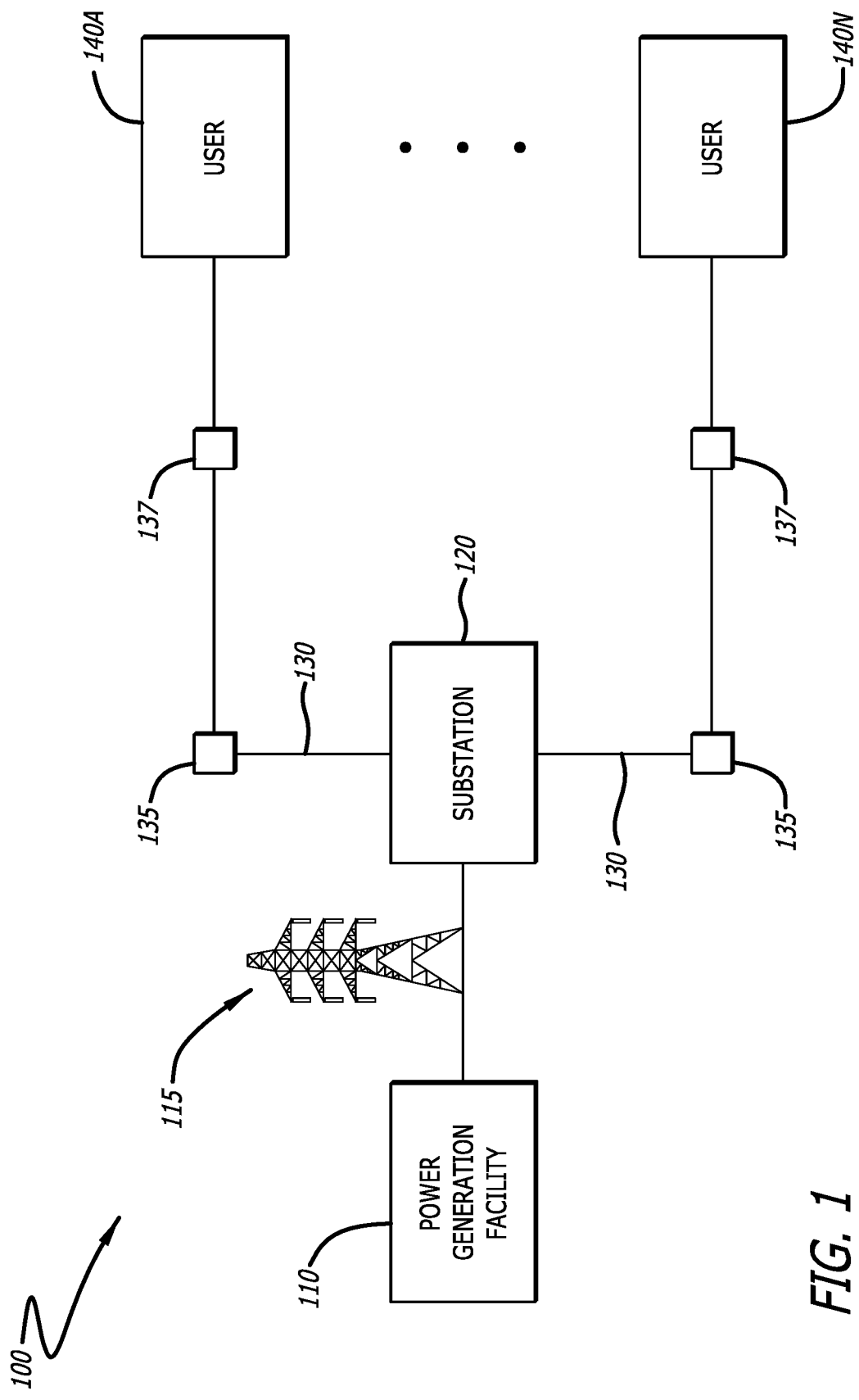
FIG. 1 illustrates a simplified block diagram illustrating an example electrical power distribution environment.

Some example embodiments will now be described more fully hereinafter with reference to the accompanying figures, in which some, but not necessarily all, embodiments are shown. Because inventions described herein may be embodied in many different forms, the invention should not be limited solely to the embodiments set forth herein; rather, these embodiments are provided so that this disclosure will satisfy applicable legal requirements.

Many modifications and other embodiments of the disclosure set forth herein will come to mind to one skilled in the art to which this disclosure pertains having the benefit of the teachings presented in the foregoing description and the associated drawings. Therefore, it is to be understood that the embodiments are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly describe herein are also contemplated as may be set forth in some of the appended claims. Although specific terms are employed herein, they are used in a generic and descriptive sense only and not for purposes of limitation.

The terms "data," "content," "information," "electronic information," "signal," "command," and similar terms may be used interchangeably to refer to data capable of being transmitted, received, and/or stored in accordance with embodiments of the present invention. Thus, use of any such terms should not be taken to limit the spirit or scope of embodiments of the present invention. Further, where a first computing device is described herein to receive data from a second computing device, it will be appreciated that the data may be received directly from the second computing device or may be received indirectly via one or more intermediary computing devices, such as, for example, one or more servers, relays, routers, network access points, base stations, hosts, and/or the like, sometimes referred to herein as a "network." Similarly, where a first computing device is described herein as sending data to a second computing device, it will be appreciated that the data may be sent directly to the second computing device or may be sent indirectly via one or more intermediary computing devices, such as, for example, one or more servers, remote servers, cloud-based servers (e.g., cloud utilities), relays, routers, network access points, base stations, hosts, and/or the like.

The terms "comprising" means including but not limited to, and should be interpreted in the manner it is typically used in the patent context. Use of broader terms such as comprises, includes, and having should be understood to provide support for narrower terms such as consisting of, consisting essentially of, and comprised substantially of.

The terms "in one embodiment," "according to one embodiment," "in some embodiments," and the like generally may refer to the fact that the particular feature, structure, or characteristic following the phrase may be included in at least one embodiment of the present invention. Thus, the particular feature, structure, or characteristic may be included in more than one embodiment of the present invention such that these phrases do not necessarily refer to the same embodiment.

The term "example" is used herein to mean "serving as an example, instance, or illustration." Any implementation described herein as "example" is not necessarily to be construed as preferred or advantageous over other implementations.

The terms "computer-readable medium" and "memory" refer to non-transitory storage hardware, non-transitory storage device or non-transitory computer system memory that may store computer-executable instructions or software programs that may be accessed by a controller, a microcontroller, a computational system or a module of a computational system. A non-transitory computer-readable medium may be accessed by a computational system or a module of a computational system to retrieve and/or execute the computer-executable instructions or software programs stored on the medium. Exemplary non-transitory computer-readable media may include, but are not limited to, one or more types of hardware memory, non-transitory tangible media (for example, one or more magnetic storage disks, one or more optical disks, one or more USB flash drives), computer system memory or random access memory (such as, DRAM, SRAM, EDO RAM), and the like.

The term "computing device" may refer to any computer embodied in hardware, software, firmware, and/or any combination thereof. Non-limiting examples of computing devices include a personal computer, a server, a laptop, a mobile device, a smartphone, a fixed terminal, a personal digital assistant ("PDA"), a kiosk, a custom-hardware device, a wearable device, a smart home device, an Internet-of-Things ("IoT") enabled device, and a network-linked computing device.

The term "control system" is used herein to refer to any one or all of programmable logic controllers (PLCs), programmable automation controllers (PACs), industrial computers, desktop computers, personal data assistants (PDAs), laptop computers, tablet computers, smart books, palm-top computers, personal computers, smartphones, server devices, and similar electronic devices equipped with at least a processor and any other physical components necessary to perform the various operations described herein.

The term "fiber optic network" is used herein to refer to a communication network which includes one or more optical fiber cables, which may be used facilitate the transfer of a signal (e.g., telemetry data) between respective terminals (e.g., a starting node or optical line terminal (OLT) and a terminating node or optical network terminal (ONT)). At least a portion of each optical fiber cable may further be disposed within a cable jacket, which may serve to protect the optical fiber cable from environmental conditions and ensure long-term durability. Additionally, the cable jacket may minimize attenuation of carried signals due to microbleeding. In some embodiments, the fiber optic network is a passive optical network (PON). A PON may use one or more fiber optic splitters to divide individual optical fiber cables among two or more ONTs, thus reducing the number of fiber optic cables needed for connectivity and the number of active devices requiring electrical power. A PON may utilize wavelength-division multiplexing (e.g., coarse wavelength division multiplexing (CWDM or dense wavelength division multiplexing (DWDM)) to permit bidirectional communications and/or a multiplication of capacity of the fiber optic network. In some embodiments, downstream signals provided by an ONT are received by all ONTs. In some embodiments, these downstream signals are encrypted using any suitable technique to prevent eavesdropping. In some embodiments, the fiber optic terminals may correspond to terminals at a central office (CO) or head end (HE) facility and customer premise equipment (CPE) at a corresponding customer location, residential government, or commercial location.

The term "telemetry data" is used here to refer to data collected by various devices within the power distribution environment and transmitted via the fiber optic network. For example, the telemetry data may be collected by smart meters at a customer premises, transformers, down-line reclosers, and distributed power generation facilities, and/or the like. Telemetry data may be transmitted via the fiber optic network in sub-millisecond intervals. In some embodiments, the telemetry data may be encrypted using an encryption key. The encryption key may be a symmetric encryption key which is shared between two or more active devices or other devices within the fiber optic network. The encryption key may correspond to a symmetric key algorithm, such as advanced encryption standard (AES), Blowfish, data encryption standard (DES), and/or the like.

Overview

As noted previously, current electric operations do not enable the systematic identification of power theft by malicious actors without physical inspection of an electric line. Accordingly, a need exists for new tools and techniques for identifying and classifying power loss that may be indicative of power theft.

To address this need, example embodiments described herein rely upon an enhanced electrical power distribution environment including a fiber optic network to enable the capture of impedance measurements at a transformer adjacent to a customer premise and at a meter at the customer premise. Leveraging the data gathered from these devices, example embodiments produce evolving estimates of power loss for the customer premise. From this estimated power loss information, a control system can systematically detect anomalous changes in power loss that may indicate possible theft of power.

Figure 2:
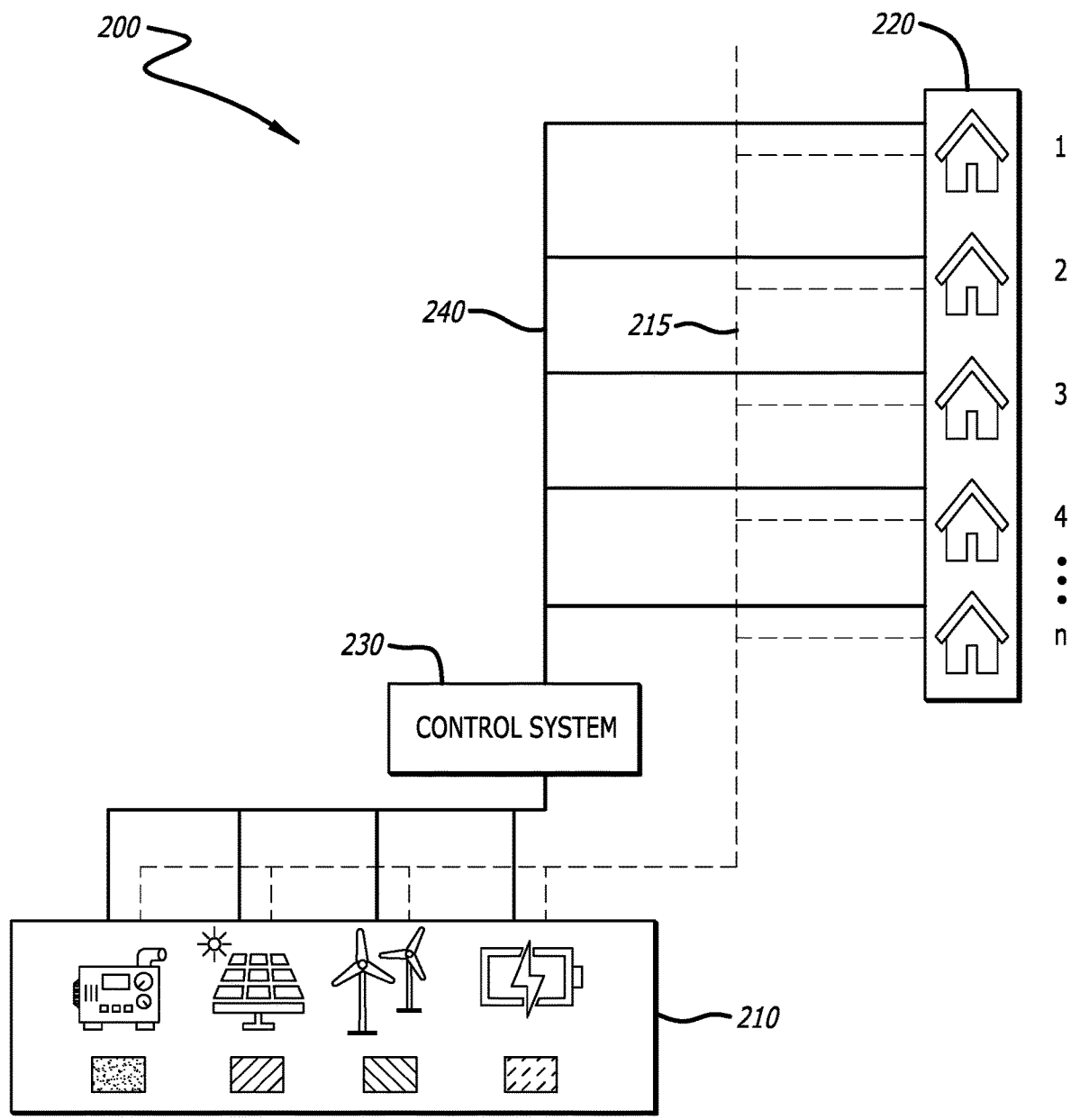
FIG. 2A illustrates a simplified block diagram of an example electrical power distribution environment and corresponding fiber optic network, in accordance with some example embodiments described herein.
FIG. 2B illustrates a close-up view of a portion of the electrical power distribution environment shown in FIG. 2A, in accordance with some example embodiments described herein.
FIG. 2C illustrates a diagram of a customer premise along with corresponding devices near the customer premise, in accordance with some example embodiments described herein.

FIG. 2A illustrates a simplified block diagram of an example electrical power distribution environment 200 enhanced by a corresponding fiber optic network, in accordance with some example embodiments described herein. FIG. 2A illustrates a series of power generating facilities 210 (which may comprise facilities that generate electricity from fossil fuels, solar energy, geothermal energy, nuclear energy, potential energy (e.g., with a hydroelectric facility), wind energy, and/or chemical energy.) that may be provide power to a series of users 220 via a distribution network 215. While power generation facilitates 110 are traditionally located in fixed locations within an environment remote from heavily populated areas and connected to the rest of the environment via transmission lines, many renewable power generation facilitates (e.g., wind, solar, fuel-based generators, and battery enclaves) may be distributed throughout the environment. In addition, however, FIG. 2A illustrates a control system 230 that may exchange information with the power generating facilities 210 and the users 220 via a fiber optic network 240. Various components of the control system 230 are described in greater detail below in connection with FIG. 3. The fiber optic network 240 may connect to just the endpoints in the electrical power distribution environment 200 or may connect to all entities (including transformers, switches, circuit breakers, reclosers, etc.) in the electrical power distribution environment 200.

Optical fiber cables within the fiber optic network 240 may be used facilitate the transfer of a signal (e.g., telemetry data) between respective terminals (e.g., between OLT and ONTs). At least a portion of each optical fiber cable may further be disposed within a cable jacket, which may serve to protect the optical fiber cable from environmental conditions and ensure long-term durability. Additionally, the cable jacket may minimize attenuation of carried signals due to microbleeding. Connection of the fiber optic network to the various entities in the electrical power distribution environment 200 enables near-real-time communication between any two entities in the environment with any other entity.

The fiber optic network 240 may comprise a PON to reduce the number of fiber optic strands needed for connectivity and the number of active devices requiring electrical power, and may utilize wavelength-division multiplexing (e.g., CWDM or DWDM) to permit bidirectional communications and/or a multiplication of capacity of the fiber optic network. A PON may use one or more fiber optic splitters to divide individual optical fiber cables among two or more ONTs, thus reducing the number of fiber optic cables needed for connectivity and the number of active devices requiring electrical power. In some embodiments, downstream signals provided by an OLT are received by all ONTs. In some embodiments, the fiber optic terminals may include customer premise equipment (CPE), central office (CO), or head end (HE) facility terminals.

The control system 230 leverages the existence of the fiber optic network 240 to receive telemetry data (e.g., small data packets transmitted in sub-millisecond intervals) from various devices in the electrical power distribution environment 200. From this telemetry data, the control system may calculate various results that may be beneficially used for management of the electrical power distribution environment 200. For instance, impedance may be calculated at various points along an electric line, and a change in impedance (or delta impedance) may be calculated for electric line segments between two devices. Specifically, the change in impedance between a transformer adjacent to a customer premise and a power meter at the customer premise can enable better monitoring of power utilization and identification of anomalous activity that may indicate power theft.

Figure 2B:
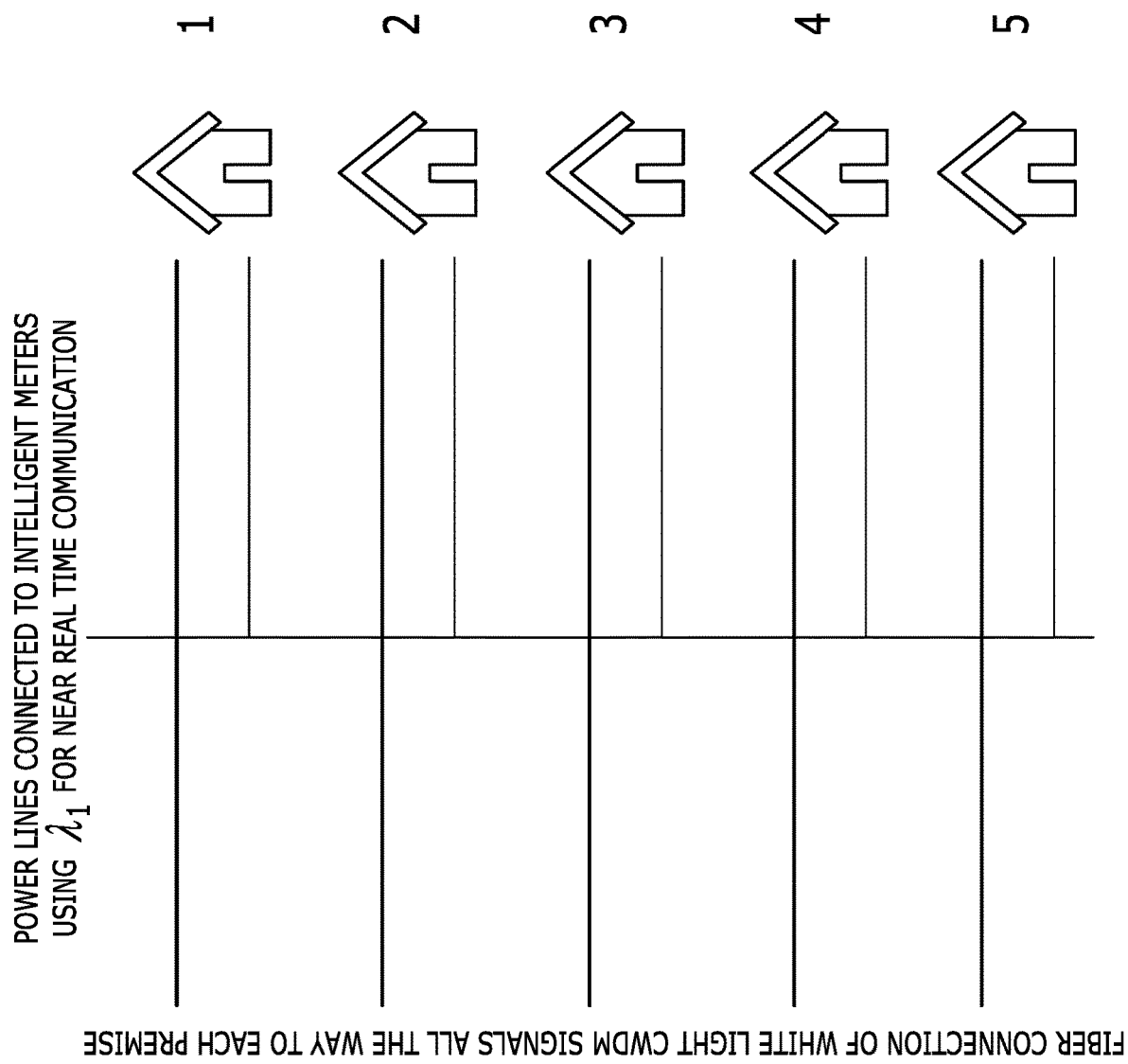

In FIG. 2B, a close-up view is shown of a portion of the electrical power distribution environment 200 enhanced by a corresponding fiber optic network. A transformer (not shown in FIG. 2B) may serve one or more of customer premises 1, 2, 3, 4, and 5. By capturing telemetry data from the transformer and meters for the customer premises it serves, example embodiments may enable calculation of the power loss from the transformer to each customer premise. This power loss may be estimated by measuring the change in impedance between meters located at transformer and the corresponding customer premises.

Figure 2C:
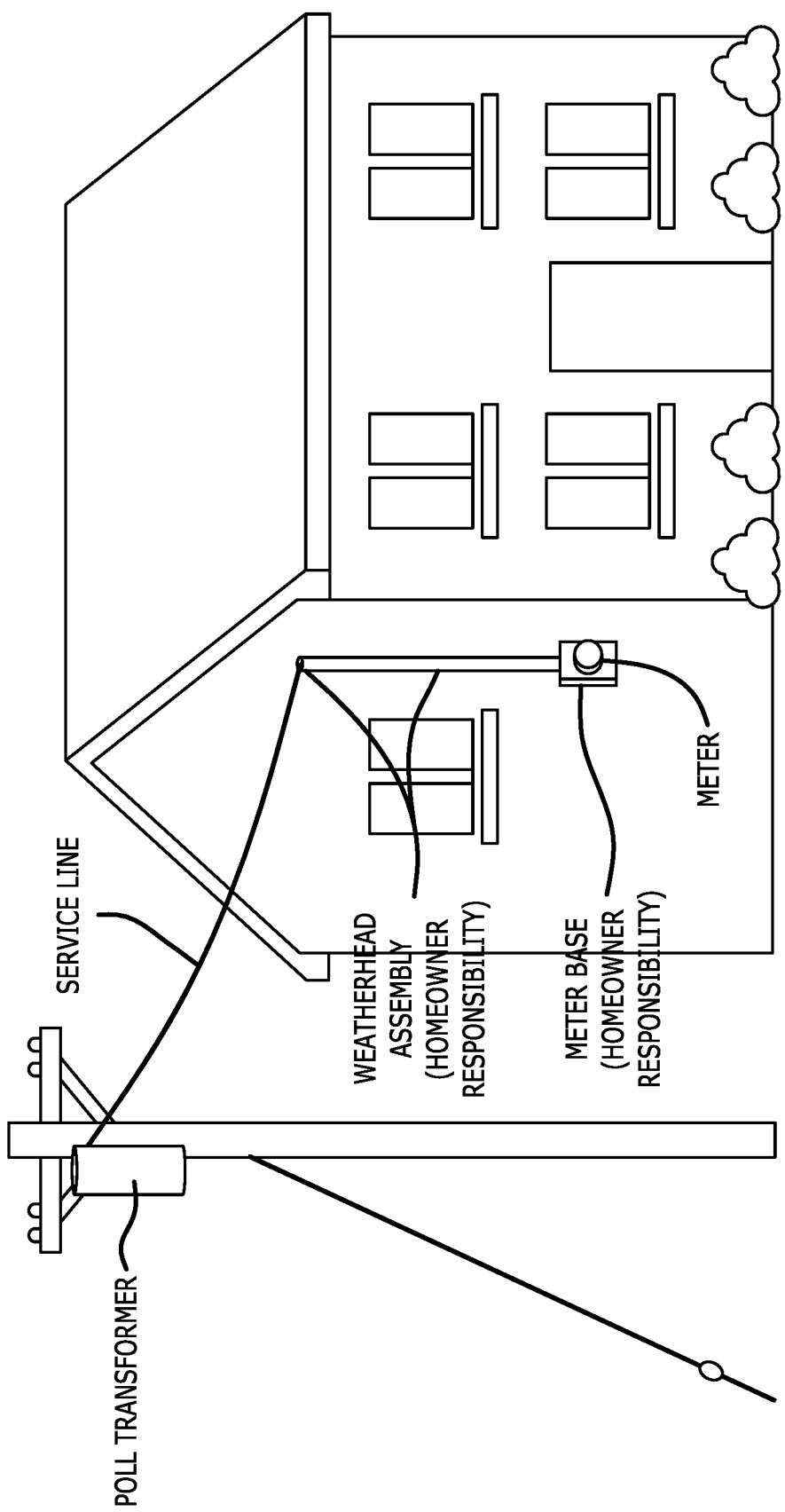

Near real-time data capture from various active devices in the electric grid facilitates the capture of these impedance measurements, and may further facilitate capture of other types of information as well (e.g., voltage and current for each line segment). A non-contiguous electric wire defines a line segment. FIG. 2C illustrates an example diagram of a customer premise along with corresponding devices in nearby proximity to the customer premise from which measurements may be captured. Example electric line segments are from the transformer on one pole to the transformer on the next pole and from the transformer along the service line to the electric meter on a building. Data capture from these various devices may occur in sub-second intervals. All changes in data capture may cause data transmissions occurrence, whereas updates may be sent by configuration if no changes occur. Simultaneously storing and calculation may occur for each received data transmission, and the calculation performed may trigger alerts when they indicate significant changes in delta impedance or other measured characteristics.

As described in in connection with FIG. 4 below, by identifying changes over time in delta impedance change, example embodiments may further utilize machine learning modeling to identify anomalous changes in delta impedance that may indicate power theft, and may thereafter prompt transmission of an alert to an appropriate party for further investigation and any necessary remediation.

Although a high level explanation of the operations of example embodiments has been provided above, specific details regarding the configuration of such example embodiments are provided below.

Example Implementing Apparatuses

Figure 3:
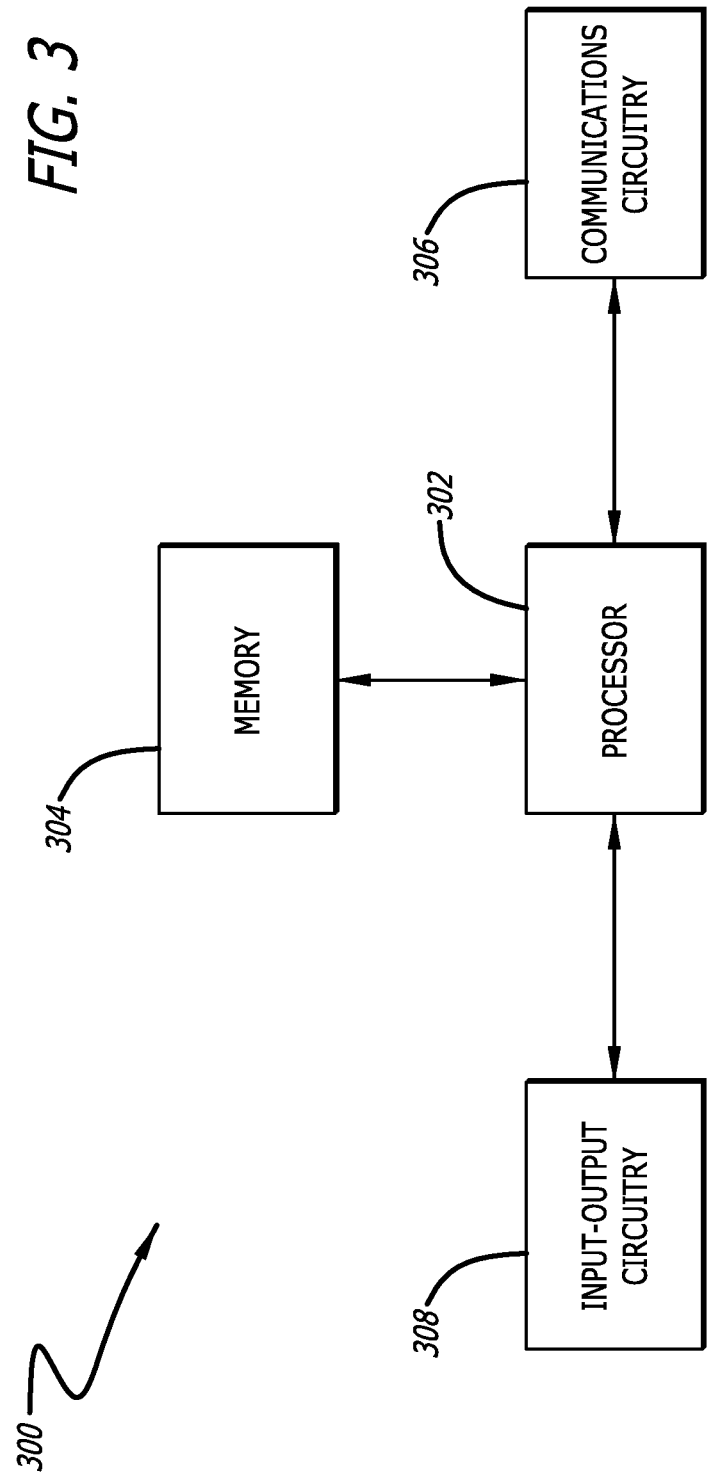
FIG. 3 illustrates a schematic block diagram of example circuitry embodying a device that may perform various operations in accordance with example embodiments described herein.

FIG. 3 illustrates an apparatus 300 that may comprise an example control system 230 that may implement example embodiments described herein. The apparatus may include processor 302, memory 304, communications circuitry 306, and input-output circuitry 308, each of which will be described in greater detail below, along with and any number of additional hardware components not expressly shown in FIG. 3. While the various components are only illustrated in FIG. 3 as being connected with processor 302, it will be understood that the apparatus 300 may further comprises a bus (not expressly shown in FIG. 3) for passing information amongst any combination of the various components of the apparatus 300. The apparatus 300 may be configured to execute various operations described above, as well as those described below in connection with FIG. 3.

The processor 302 (and/or co-processor or any other processor assisting or otherwise associated with the processor) may be in communication with the memory 304 via a bus for passing information amongst components of the apparatus. The processor 302 may be embodied in a number of different ways and may, for example, include one or more processing devices configured to perform independently. Furthermore, the processor may include one or more processors configured in tandem via a bus to enable independent execution of software instructions, pipelining, and/or multithreading. The use of the term "processor" may be understood to include a single core processor, a multi-core processor, multiple processors of the apparatus 300, remote or "cloud" processors, or any combination thereof.

The processor 302 may be configured to execute software instructions stored in the memory 304 or otherwise accessible to the processor (e.g., software instructions stored on a separate storage device). In some cases, the processor may be configured to execute hard-coded functionality. As such, whether configured by hardware or software methods, or by a combination of hardware with software, the processor 302 represent an entity (e.g., physically embodied in circuitry) capable of performing operations according to various embodiments of the present invention while configured accordingly. Alternatively, as another example, when the processor 302 is embodied as an executor of software instructions, the software instructions may specifically configure the processor 302 to perform the algorithms and/or operations described herein when the software instructions are executed.

Memory 304 is non-transitory and may include, for example, one or more volatile and/or non-volatile memories. In other words, for example, the memory 304 may be an electronic storage device (e.g., a computer readable storage medium). The memory 304 may be configured to store information, data, content, applications, software instructions, or the like, for enabling the apparatus to carry out various functions in accordance with example embodiments contemplated herein.

The communications circuitry 306 may be any means such as a device or circuitry embodied in either hardware or a combination of hardware and software that is configured to receive and/or transmit data from/to a network and/or any other device, circuitry, or module in communication with the apparatus 300. In this regard, the communications circuitry 306 may include, for example, a network interface for enabling communications with a wired or wireless communication network. For example, the communications circuitry 306 may include one or more network interface cards, antennas, buses, switches, routers, modems, and supporting hardware and/or software, or any other device suitable for enabling communications via a network. Furthermore, the communications circuitry 306 may include the processing circuitry for causing transmission of such signals to a network or for handling receipt of signals received from a network.

The apparatus 300 may include input-output circuitry 308 configured to provide output to a user and, in some embodiments, to receive an indication of user input. It will be noted that some embodiments will not include input-output circuitry 308, in which case user input may be received via a separate device. The input-output circuitry 308 may comprise a user interface, such as a display, and may further comprise the components that govern use of the user interface, such as a web browser, mobile application, dedicated client device, or the like. In some embodiments, the input-output circuitry 308 may include a keyboard, a mouse, a touch screen, touch areas, soft keys, a microphone, a speaker, and/or other input/output mechanisms. The input-output circuitry 308 may utilize the processor 302 to control one or more functions of one or more of these user interface elements through software instructions (e.g., application software and/or system software, such as firmware) stored on a memory (e.g., memory 304) accessible to the processor 302.

In some embodiments, various components of the apparatus 300 may be hosted remotely (e.g., by one or more cloud servers) and thus not all components must reside in one physical location. Moreover, some of the functionality described herein may be provided by third party circuitry. For example, apparatus 300 may access one or more third party circuitries via any sort of networked connection that facilitates transmission of data and electronic information between the apparatus 300 and the third party circuitries. In turn, the apparatus 300 may be in remote communication with one or more of the components describe above as comprising the apparatus 300.

As will be appreciated based on this disclosure, some example embodiments may take the form of a computer program product comprising software instructions stored on at least one non-transitory computer-readable storage medium (e.g., memory 304). Any suitable non-transitory computer-readable storage medium may be utilized in such embodiments, some examples of which are non-transitory hard disks, CD-ROMs, flash memory, optical storage devices, and magnetic storage devices. It should be appreciated, with respect to certain devices embodied by apparatus 300 as described in FIG. 3, that loading the software instructions onto a computing device or apparatus produces a special-purpose machine comprising the means for implementing various functions described herein.

Having described specific components of the apparatus 300, example embodiments are described below.

Example Operations

Figure 4:
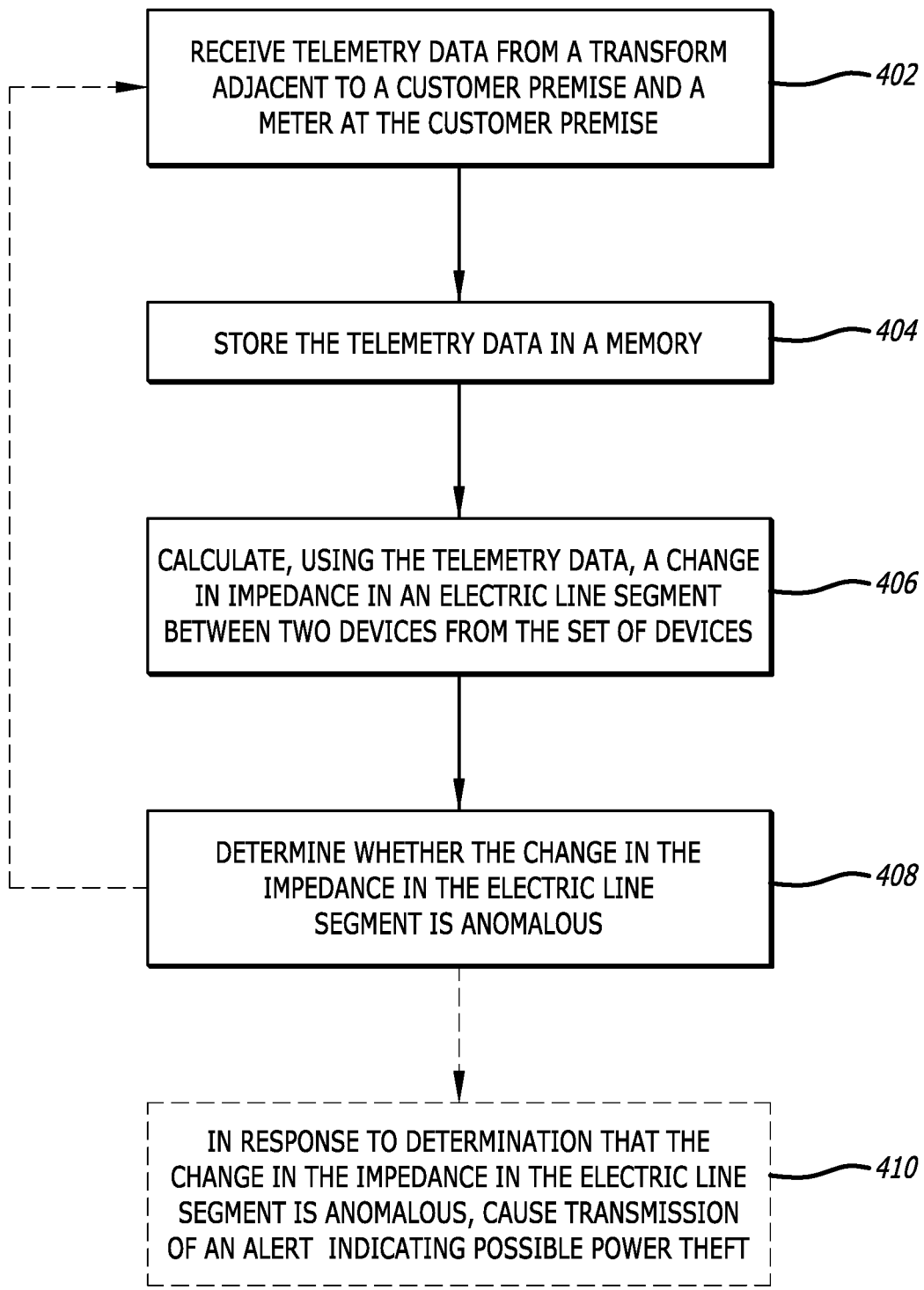
FIG. 4 illustrates an example flowchart for power theft detection, in accordance with some example embodiments described herein.

Turning to FIG. 4, an example flowchart is illustrated that contains example operations implemented by various embodiments contemplated herein. The operations illustrated in FIG. 4 may, for example, be performed by an apparatus 300, which is shown and described in connection with FIG. 3. To perform the operations described below, the apparatus 300 may utilize one or more of processor 302, memory 304, communications circuitry 306, input-output circuitry 308, other components, and/or any combination thereof. It will be understood that user interaction with the apparatus 300 may occur directly via input-output circuitry 308, or may instead be facilitated by a device that in turn interacts with apparatus 300.

As shown by operation 402, the apparatus 300 includes means, such as processor 302, memory 304, communications circuitry 306, input-output circuitry 308, or the like, for receiving telemetry data from a transformer adjacent to a customer premise and a meter at the customer premise. Power output at each transformer may be captured and transmitted via a device at the transformer connected to a fiber optic network. Similarly, power output at the meter may be captured by a similar device. Data may be captured digitally from a smart-meter, or if a legacy meter is used, the data may be captured from the meter using camera technology. The readings from each transformer/meter pair may be synchronized to facilitate downstream analysis. The telemetry data may be received via a fiber optic network, which may be a passive-optical network. The use of CWDM, DWDM, or any other multiplexing technique may permit near-real-time telemetry data to be collected from any number of devices over the fiber optic network infrastructure. The telemetry data may include measurements of impedance from the various devices at their corresponding position along an electric line, and may also include measurements of other values by the devices, such as voltage, current, or the like. It will be appreciated that in some implementations, an alternative method of transmitting the telemetry data may be utilized besides a fiber optic network (e.g., any other Internet-based communications). Although the telemetry data may be received from a transformer and a meter at a customer premise, it will be understood that telemetry data may be received from any number of devices located within the electrical power distribution environment 200, such as smart meters at other customer premises, other transformers, down-line reclosers, and distributed power generation facilities. These devices may transmit the telemetry data periodically at any desired frequency (e.g., sub-second intervals, sub-millisecond intervals, or the like).

Telemetry data captured by a meter at a customer premise may be transmitted using a unique tag including four primary identifying elements: (i) a meter identifier, (ii) a meter serial number, (iii) an address identifier, (iv) a customer identifier, and (v) a date-time-group of reading. Telemetry data captured by a transformer may be transmitted using a unique tag including a series of primary identifying elements including: (i) a transformer identifier, (ii) a mount type (e.g., P or G), (iii) a location (e.g., latitude/longitude), (iv) an electric line identifier, and (v) a date-time-group of reading. The telemetry data may be transmitted by a particular device upon occurrence, or periodically if no changes occur.

The apparatus 300 may maintain (e.g., in memory 304) a unique identifier for each transformer and meter pairing. It will be understood that, although a transformer may pair with multiple meters, meters may only pair with a single transformer.

As shown by operation 404, the apparatus 300 includes means, such as processor 302, memory 304, communications circuitry 306, input-output circuitry 308, or the like, for storing the telemetry data in a memory. In some embodiments, the stored telemetry data may be accessed later for calculation purposes.

In some embodiments, the stored telemetry data may be used as training data for one or more stored machine learning models, which may be trained using the stored telemetry data as is or modified telemetry data (e.g., labelled by users). The particular machine learning models may be discussed in greater detail below in operation 408.

As shown by operation 406, the apparatus 300 includes means, such as processor 302, memory 304, communications circuitry 306, input-output circuitry 308, or the like, for calculating, using the telemetry data, a change in impedance in an electric line segment between the transformer and the meter. To this end, calculating the change in the impedance in the electric line segment between the two devices may include retrieving impedance measurements from the two devices, and calculating a difference between the impedance measurements received from the two devices.

In some embodiments, the telemetry data received from each particular device may not include an impedance measurement by the particular device. In such embodiments, to retrieve an impedance measurement for a given device, the apparatus 300 may further include means, such as processor 302, memory 304, communications circuitry 306, input-output circuitry 308, or the like, for deriving the impedance. For instance, the apparatus 300 may utilize the following equation to calculate impedance at a particular device:

$$Z = \sqrt{R^2 + (X_L - X_C)^2},$$

where Z is the calculated impedance, and R is resistance, $X_L$ is inductive reactance, and $X_C$ is capacitive reactance, each of which may be gathered for the particular device.

Once the impedance is known from both of the two devices, the change in impedance may thereafter be calculated in a straightforward manner. For instance, where $Z_1$ is an impedance measurement from a first device and $Z_2$ is an impedance measurement from a second device, $\Delta Z_{1,2}$ (the change in impedance of the electric line between the first device and the second device) may be calculated through the arithmetic operation $\Delta Z_{1,2} = Z_2 - Z_1$.

As shown by operation 408, the apparatus 300 includes means, such as processor 302, memory 304, communications circuitry 306, input-output circuitry 308, or the like, for determining whether the change in the impedance in the electric line segment is anomalous. To facilitate determination of anomalous impedance changes, signal processing may be used to filter normal impedance variations of the electric grid. In some implementations, the apparatus 300 may determine whether the change in the impedance in the electric line segment is anomalous using a machine learning model.

For instance, the apparatus 300 may include means, such as processor 302, memory 304, communications circuitry 306, input-output circuitry 308, or the like, for training the machine learning model using a historical training data set comprising data regarding historical changes in impedance in electric line segments between transformers adjacent to customer premises and meters at the customer premises. In some implementations, the apparatus 300 may determine whether the change is impedance is anomalous using a machine learning model trained to process the change in impedance to generate a decision on whether the change in impedance is anomalous (e.g., binary classification of anomalous or non-anomalous). The machine learning model may process the change in impedance and output a determined anomalous determination decision. In some embodiments, the output anomalous determination decision is a binary classification output. For example, the output anomalous determination decision may be either "anomalous" or "non-anomalous".

In some embodiments, the machine learning model may be a neural network, such as a convolutional neural network (CNN). In some embodiments, the machine learning model is a classification machine learning model and in particular, may provide binary classification. In some embodiments, the machine learning model is a trained machine learning model which may be trained and/or periodically retrained. The machine learning model may be trained and/or retrained by retrieving, from the memory, a plurality of previously calculated changes in the impedance in the electric line segment between the transformer and the meter. The machine learning model may process the plurality of previously calculated changes in the impedance in the electric line segment between the transformer and the meter to predict whether the change is anomalous. To this end, the machine learning model may be trained using historical data.

Figure 5:
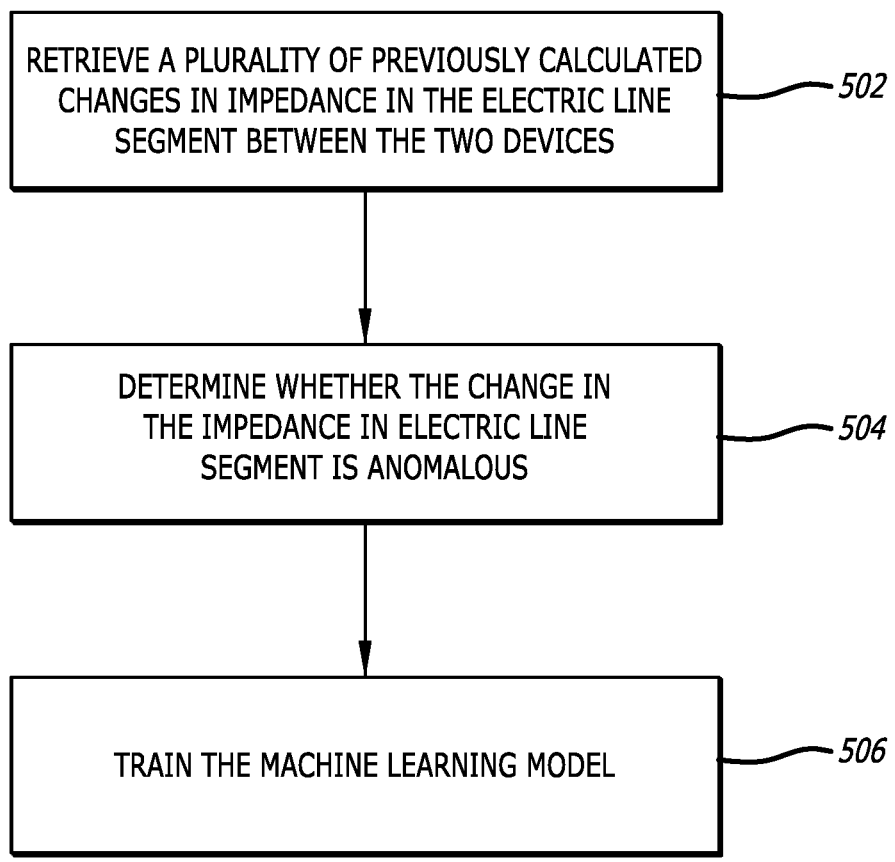
FIG. 5 illustrates an example flowchart for a machine learning model training routine, in accordance with some example embodiments described herein.

FIG. 5 illustrates and example training routine that may be used to train and/or retrain the machine learning model. As shown by operation 502, the apparatus 300 includes means, such as processor 302, memory 304, communications circuitry 306, input-output circuitry 308, or the like, for retrieving a plurality of previously calculated changes in impedance in the electric line segment between the transformer and the meter. This retrieved data may correspond to a historical training data set comprising data regarding historical changes in impedance in electric lines and known anomalous determinations.

As shown by operation 504, the apparatus 300 includes means, such as processor 302, memory 304, communications circuitry 306, input-output circuitry 308, or the like, for determining whether the change in the impedance in the electric line segment is anomalous. The machine learning model may be configured to process the retrieved plurality of data to generate the anomalous determination.

As shown by operation 506, the apparatus 300 includes means, such as processor 302, memory 304, communications circuitry 306, input-output circuitry 308, or the like, for training the machine learning model. The historical training data set may include labels indicative of known anomalous determinations for each change in impedance in the historical training data set. The output anomalous determination may be compared to the known anomalous determination using any suitable machine learning techniques, such as gradient boosting, random forests, decision trees, logistic regression, support vector machines, etc. The machine learning model may be trained periodically and/or semi-periodically using the historical training data set to improve the accuracy of the machine learning model.

Returning now to FIG. 4, following operation 408, the procedure may optionally advance to operation 410 in an instance in which an anomaly is discovered. However, the procedure may alternatively, or in addition, return to operation 402 for receipt of new telemetry data from the transformer and meter and subsequent evaluation of the new telemetry data. Accordingly, the procedure may continuously monitor the transformer and meter combination to detect anomalous power loss indicating of power theft.

As shown by operation 410, the apparatus 300 includes means, such as processor 302, memory 304, communications circuitry 306, input-output circuitry 308, or the like, for, in an instance in which the control system determines that the change the impedance in the electric line segment is anomalous, causing transmission of an alert indicating possible power theft. This operation is illustrated using a dotted line to indicate that it may or may not occur. For instance, if no anomaly is discovered, the procedure may end at operation 408 and operation 410 need not be performed.

In an instance the change is impedance is determined to be anomalous, the alert may be transmitted to one or more utility providing devices and/or one or more devices corresponding associated with the customer premise. For example, the alert may be provided to a user paying utilities at the customer premise where the anomalous determination was identified via email. As such, the utility company providing the power to the transformer and the customer paying for the utility may be informed of this determination such that action may be taken.

Moreover, in various embodiments, certain calculations performed by the apparatus 300 may be performed via distributed elements of the apparatus 300. For instance, a distributed processing design may in some cases allow for the segregation of rapid processing demands through different databases for near-real-time calculations and long-term data analysis, facilitating scalability and agility.

FIG. 4 illustrates operations performed by apparatuses, methods, and computer program products according to various example embodiments. It will be understood that each flowchart block, and each combination of flowchart blocks, may be implemented by various means, embodied as hardware, firmware, circuitry, and/or other devices associated with execution of software including one or more software instructions. For example, one or more of the operations described above may be embodied by software instructions. In this regard, the software instructions which embody the procedures described above may be stored by a memory of an apparatus employing an embodiment of the present invention and executed by a processor of that apparatus. As will be appreciated, any such software instructions may be loaded onto a computing device or other programmable apparatus (e.g., hardware) to produce a machine, such that the resulting computing device or other programmable apparatus implements the functions specified in the flowchart blocks. These software instructions may also be stored in a computer-readable memory that may direct a computing device or other programmable apparatus to function in a particular manner, such that the software instructions stored in the computer-readable memory produce an article of manufacture, the execution of which implements the functions specified in the flowchart blocks. The software instructions may also be loaded onto a computing device or other programmable apparatus to cause a series of operations to be performed on the computing device or other programmable apparatus to produce a computer-implemented process such that the software instructions executed on the computing device or other programmable apparatus provide operations for implementing the functions specified in the flowchart blocks.

The flowchart blocks support combinations of means for performing the specified functions and combinations of operations for performing the specified functions. It will be understood that individual flowchart blocks, and/or combinations of flowchart blocks, can be implemented by special purpose hardware-based computing devices which perform the specified functions, or combinations of special purpose hardware and software instructions.

In some embodiments, some of the operations above may be modified or further amplified. Furthermore, in some embodiments, additional optional operations may be included. Modifications, amplifications, or additions to the operations above may be performed in any order and in any combination.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for power theft detection, the method comprising:

receiving, by a control system, telemetry data from a transformer adjacent to a customer premise and a meter at the customer premise;

storing, by the control system, the telemetry data in a memory;

calculating, by the control system and using the telemetry data, a change in impedance in an electric line segment between the transformer and the meter; and determining, by the control system, whether the change in the impedance in the electric line segment is anomalous, wherein determining whether the change in the impedance in the electric line segment is anomalous includes:

retrieving, by the control system and from the memory, a plurality of previously calculated changes in the impedance in the electric line segment; and determining, using a machine learning model and the plurality of previously calculated changes in the impedance in the electric line segment, whether the change in the impedance in the electric line segment is anomalous.

2. The method of claim 1, further comprising:
in an instance in which the control system determines that the change the impedance in the electric line segment is anomalous, causing, by the control system, transmission of an alert indicating possible power theft.

3. The method of claim 1, wherein the telemetry data is received via a fiber optic network.

4. The method of claim 3, wherein the telemetry data is received via passive-optical networking.

5. The method of claim 1, wherein the control system periodically receives the telemetry data from the transformer and the meter.

6. The method of claim 5, wherein the control system periodically receives the telemetry data from the transformer and the meter at sub-second intervals.

7. The method of claim 1, wherein calculating the change in the impedance in the electric line segment between the transformer and the meter includes:

retrieving, by the control system, impedance measurements from the transformer and the meter; and calculating, by the control system, a difference between the impedance measurements from the transformer and the meter.

8. The method of claim 1, further comprising:
training, by the control system, the machine learning model using a historical training data set comprising data regarding historical changes in impedance in electric line segments between transformers adjacent to customer premises and meters at the customer premises.

9. The method of claim 1, wherein the machine learning model comprises a convolutional neural network.

10. An apparatus for power theft detection, the apparatus comprising a processor and a memory storing software instructions that, when executed by the processor, cause the apparatus to:

receive telemetry data from a transformer adjacent to a customer premise and a meter at the customer premise;

store the telemetry data in a memory;

calculate, using the telemetry data, a change in impedance in an electric line segment between the transformer and the meter; and determine whether the change in the impedance in the electric line segment is anomalous, wherein determination of whether the change in the impedance in the electric line segment is anomalous includes:

retrieval of a plurality of previously calculated changes in the impedance in the electric line segment; and determination of whether the change in the impedance in the electric line segment is anomalous with a convolutional neural network and the plurality of previously calculated changes in the impedance in the electric line segment.

11. The apparatus of claim 10, the processor and a memory storing software instructions, when executed by the processor, further cause the apparatus to:

in an instance in which the change the impedance in the electric line segment is determined to be anomalous, cause transmission of an alert indicating possible power theft.

12. The apparatus of claim 10, wherein the telemetry data is received via a fiber optic network.

13. The apparatus of claim 12, wherein the telemetry data is received via passive-optical networking.

14. The apparatus of claim 10, wherein the telemetry data is received periodically from the transformer and the meter.

15. The apparatus of claim 14, wherein the telemetry data is received periodically from the transformer and the meter at sub-second intervals.

16. The apparatus of claim 10, the processor and a memory storing software instructions, when executed by the processor and when calculating the change in the impedance in the electric line segment between the transformer and the meter, further cause the apparatus to:

retrieve impedance measurements from the transformer and the meter; and calculate a difference between the impedance measurements from the transformer and the meter.

17. The apparatus of claim 10, the processor and a memory storing software instructions, when executed by the processor, further cause the apparatus to:

train the machine learning model using a historical training data set comprising data regarding historical changes in impedance in electric line segments between transformers adjacent to customer premises and meters at the customer premises.

18. The apparatus of claim 10, wherein the machine learning model comprises a convolutional neural network.

19. A computer program product for power theft detection, the computer program product comprising at least one non-transitory computer-readable storage medium storing software instructions that, when executed by an apparatus, cause the apparatus to:

receive telemetry data from a transformer adjacent to a customer premise and a meter at the customer premise;

store the telemetry data in a memory;

calculate, using the telemetry data, a change in impedance in an electric line segment between the transformer and the meter; and determine whether the change in the impedance in the electric line segment is anomalous, wherein determination of whether the change in the impedance in the electric line segment is anomalous includes:

retrieval of a plurality of previously calculated changes in the impedance in the electric line segment; and determination of whether the change in the impedance in the electric line segment is anomalous with a machine learning model and the plurality of previously calculated changes in the impedance in the electric line segment.

20. The computer program product of claim 19, the at least one non-transitory computer-readable storage medium storing software instructions that, when executed by an apparatus, further cause the apparatus to:

in an instance in which the change the impedance in the electric line segment is determined to be anomalous, cause transmission of an alert indicating possible power theft.

* * * * *